(12) United States Patent
Ebisawa et al.

(10) Patent No.: US 6,259,204 B1
(45) Date of Patent: Jul. 10, 2001

(54) ORGANIC ELECTROLUMINESCENT DEVICE

(75) Inventors: Akira Ebisawa, Ibaraki; Kouji Yasukawa, Chiba; Hiroyuki Endo; Taku Someya, both of Ibaraki; Osamu Onitsuka, Chiba, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/172,626

(22) Filed: Oct. 15, 1998

(30) Foreign Application Priority Data

Oct. 16, 1997 (JP) .................................................. 9-299524

(51) Int. Cl.⁷ .............................. H01J 1/62; H01J 63/04
(52) U.S. Cl. .......................... 313/512; 313/504; 313/506; 313/493
(58) Field of Search ..................................... 313/512, 504, 313/506, 483, 493; 315/169.3; 428/690

(56) References Cited

U.S. PATENT DOCUMENTS

| 5,821,692 | 10/1998 | Rogers et al. . |
| 5,874,804 | * 2/1999 | Rogers ................................. 313/512 |
| 5,909,081 | * 6/1999 | Eida et al. ............................ 313/504 |
| 6,049,167 | * 4/2000 | Onitsuka et al. .................... 313/512 |
| 6,111,357 | * 8/2000 | Fleming et al. ..................... 313/509 |

FOREIGN PATENT DOCUMENTS

| 0 776 147 | 5/1997 | (EP) . |
| 0 859 539 | 8/1998 | (EP) . |
| 56-30287 | 3/1981 | (JP) . |
| 60-81797 | 5/1985 | (JP) . |
| 4-212284 | 8/1992 | (JP) . |
| 8-302340 | 11/1996 | (JP) . |
| 9-274990 | 10/1997 | (JP) . |
| 10-3988 | 1/1998 | (JP) . |
| 10-41067 | 2/1998 | (JP) . |
| 10-106746 | 4/1998 | (JP) . |

* cited by examiner

*Primary Examiner*—Ashok Patel
*Assistant Examiner*—Karabi Guharay
(74) *Attorney, Agent, or Firm*—Oblon, Spivak, McClelland, Maier & Neustadt, P.C.

(57) ABSTRACT

An organic EL structure is formed on a substrate 1, and a sealing sheet is located at a position above the substrate, where the sealing sheet comes in no contact with the organic EL structure. A height from the surface of the substrate, on which an organic EL device structure in a film form is provided, to a junction of the sealing sheet with the substrate has a value larger than the value obtained by adding the size of an irregularity or undulation of the sealing sheet to the height of the organic EL structure.

8 Claims, 3 Drawing Sheets

ORGANIC ELECTROLUMINESCENT DEVICE

BACKGROUND OF THE INVENTION

The present invention relates generally to an organic EL (electroluminescent) device using an organic compound, and more specifically to an improvement in or relating to a sealing sheet used therewith In recent years, organic EL devices have been under intensive investigation. One such device is basically built up of a thin film form of hole transporting material such as triphenyldiamine (TPD) deposited by evaporation on a hole injecting electrode, a light emitting layer of fluorescent material such as an aluminum quinolinol complex ($Alq^3$) laminated thereon, and a metal (electron injecting) electrode of a metal having a low work function such as Mg and formed on the light emitting layer. This organic EL device now attracts attentions because a very high luminance ranging from several hundreds to tens of thousands $cd/m^2$ can be achieved with a voltage of approximately 10 V.

A grave problem with an organic EL device is that it is acutely sensitive to moisture. Exposure of the organic EL device to moisture, for instance, causes a light emitting layer to peel off electrode layers, or materials forming part thereof to degenerate. This results in another problem that non-light emission spots called dark spots occur or any consistent light emission cannot be kept.

One approach known to solve this problem is to fix an airtight case, a sealing layer or the like closely on a substrate to cover an organic EL multilayer structure, thereby shielding it from the outside, as typically disclosed in JP-A's 5-36475, 5-89959 and 7-169567.

However, the provision of such a sealing layer in a box form is not suitable for the mass production of organic EL devices because of a production cost increase. For such a sealing layer, inexpensive glasses are usually employed. When a glass sheet is used with no modification thereto, however, it is likely to come into contact with, or abutment on, an organic EL multilayer structure (as seen in FIG. 3), resulting in a breakdown of the organic EL structure. In an effort, a spacer or the like is used to bond a glass sealing sheet to an organic EL structure while the glass sealing sheet is kept at a height higher than the organic EL structure. Even when the portion of the glass sealing sheet bonded to the organic EL structure is kept at the required height, however, it is likely that the undulations of the glass sealing sheet and a substrate with an organic EL device stacked thereon cause the glass sealing sheet to come into contact with, or abutment on, an organic EL device structure, resulting in a breakdown of the organic EL structure or the occurrence of dark spots. When the sealing sheet is kept at a height higher than required, on the other hand, a problem arises in conjunction with airtightness, and no suitable spacer is available.

SUMMARY OF THE INVENTION

An object of the invention is to provide an organic EL device comprising a sealing sheet that can be produced at low costs yet with high productivity, and can be located in neither contact with nor abutment on an organic EL structure while there is a proper clearance between them.

As a result of studies of the contact or abutment of such a glass sealing sheet with or on an organic EL structure, the inventors have found that such contact or abutment is ascribable to the irregularities or undulations of the glass sheet. The inventors have also found that the more inexpensive the glass, the more noticeable the irregularities or undulations of the glass become, and that if a glass sealing sheet is located at a height larger than the size of an irregularity or undulation thereof, the contact or abutment of the glass sealing sheet with or on an organic EL structure can then be provided with a necessary minimum height.

The aforesaid object is achieved by the inventions defined below as (1) to (8).

(1) An organic EL device, which comprises a substrate, an organic EL structure provided on the substrate, and a sealing sheet located at a position above said substrate, where said sealing sheet is in no contact with said organic EL structure, and in which a height from a surface of said substrate, on which a film form of organic EL device structure is formed, to a junction of said sealing sheet with said substrate has a value larger than a value obtained by adding a size of an irregularity or undulation of said sealing plate to a height of said organic EL structure.

(2) The organic EL device according to (1), wherein said sealing sheet is an unground flat sheet.

(3) The organic EL device according to (1) or (2), wherein the size of said irregularity or undulation of said sealing sheet is within 60 μm.

(4) The organic EL device according to any one of (1) to (3), wherein the height from the surface of said substrate, on which said film form of organic EL structure is formed, to the junction of said sealing sheet with said substrate is up to 120 μm.

(5) The organic EL device according to any one of (1) to (4), wherein a spacer is interleaved between the surface of said substrate on which said film form of organic EL structure is formed and the junction of said sealing sheet with said substrate.

(6) The organic EL device according to any one of (1) to (5), wherein a recess is provided in a lower side of said sealing sheet and in at least an area of said sealing sheet that opposes to said organic EL structure, so that the height from the surface of said substrate, on which said film form of organic EL structure is formed, to the junction of said sealing sheet with said substrate is adjusted by a depth of said recess.

(7) The organic EL device according to (6), wherein the recess in said sealing sheet is formed by sandblasting or cutting.

(8) The organic EL device according to (6) or (7), wherein said sealing sheet is bonded to said substrate using an adhesive agent having a spacer of 3 to 10 μm.

DETAILED EXPLANATION OF THE PREFERRED EMBODIMENTS

Figure 1:
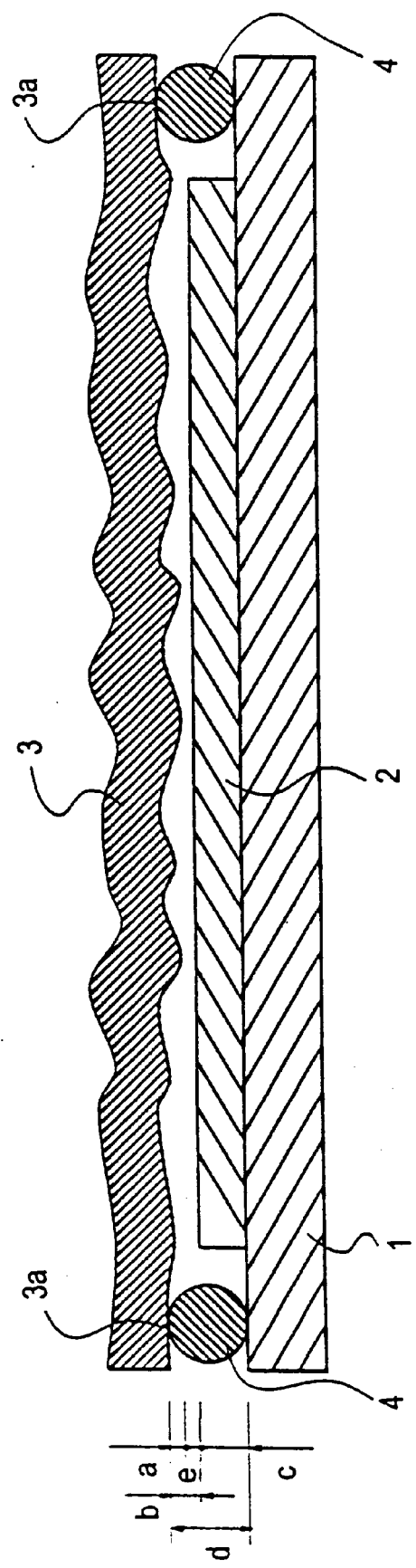
FIG. 1 is a sectional view illustrating one embodiment of the organic EL device according to the invention.

Some specific embodiments of the invention will now be explained at great length.

The organic EL device of the invention comprises a substrate, an organic EL structure formed on the substrate, and a sealing sheet located at a position above the substrate, where the sealing sheet is in no contact with the organic EL device. The height from the surface of the substrate, on which the organic EL structure in a film form is formed, to the junction of the sealing sheet with the substrate has a value larger than the value obtained by adding the size of the irregularity or undulation of the sealing sheet to the height of the organic EL device. By locating the sealing sheet at the height having a value larger than the value obtained by adding the size of the irregularity or undulation of the sealing sheet to the height of the organic EL device, it is thus possible to prevent any interference between the sealing sheet and the organic EL structure with a necessary minimum height.

The sealing sheet in a flat sheet form may be made of transparent or translucent materials such as glasses, quartz, and resins. However, preference is given to glasses. Preferable glass materials, for instance, include soda lime glass, lead alkali glass, borosilicate glass, aluminosilicate glass, and silica glass. Preferably, the glass materials are formed into sheets by rolling-out, down loading, fusion, and floating processes. If required, the glass materials are treated on their surfaces by grinding, $SiO_2$ barrier coating or the like. Of these glass materials, a soda lime glass sheet made by the floating process and subjected to no surface treatment is preferable because it can be used at low costs.

The size of the irregularity or undulation of the sealing sheet is herein defined by a displacement of irregularities of other portions of an inside major surface of the sealing sheet with respect to a plane that connects together junctions of the sealing sheet with the substrate. The junction of the sealing sheet is understood to refer to an area thereof that opposes the substrate and is other than an area thereof that opposes the organic EL structure, said area of the sealing sheet being fixable to the substrate using an adhesive agent. The size of such an irregularity or undulation is preferably up to 60 $\mu$m, and more preferably up to 50 $\mu$m. The lower limit to that size is at least 1 $\mu$m although the invention is not particularly limited thereto. Even more preferably, the size is within the range of 10 to 40 $\mu$m. A sealing sheet having irregularities or undulations within this range is inexpensively available, and is not affected by such irregularities or undulations.

Preferably, the sealing sheet is located at a height that is larger than the thickness obtained by adding the irregularity or undulation of the sealing sheet to the height of the film form of organic EL structure (that is understood to refer to an organic EL structure comprising a laminate of organic layers such as hole injecting electrode and light-emitting layers and an electron injecting electrode, etc. except the sealing sheet). Preferably in this case, a gap from the lowermost end face of the sealing sheet to the upper end of the organic EL structure is at least 40 $\mu$m, and especially at least 100 $\mu$m. Although there is no upper limit to the gap, it is preferred that the gap is at most about 200 $\mu$m, because too large a gap may offer a problem in connection with the sealing effect achieved.

The sealing sheet may be used without intermediary. However, it is preferable that a recess having some depth is provided in the lower side (inside) of the sealing sheet, i.e., the surface of the sealing sheet that opposes to the organic EL structure. In this case, the lower end face of the sealing sheet that represents a reference with respect to the organic EL structure is defined by the bottom of the formed recess. The recess is formed by cutting off or otherwise removing at least a portion of the sealing sheet that opposes to the organic EL structure, or may possibly come in contact with or abutment on the organic EL structure. Although it is acceptable that the bottom of the recess has some irregularities or undulations, yet it is preferable that the portion of the sealing sheet nearest to the organic EL structure is located at a height higher than the upper end of the organic EL structure. Although varying depending on the thickness of the sealing sheet, the depth of the recess to be provided is preferably about 5 to 30% and more preferably about 5 to 20% of the sealing sheet, or usually about 50 to 200 $\mu$m and especially about 80 to 150 $\mu$m.

The recess may be provided in the sealing sheet by a suitable process selected from the means known to machine or otherwise process glasses, quartz, resins, etc. For instance, glass may be processed by sandblasting, etching, ultrasonic processing, etc. Of these processes, sandblasting and grinding are preferred with sandblasting being most preferred because of its low production cost.

How to control the height of the sealing sheet is not critical to the practice of the invention. However, it is preferable to use a spacer. By use of the spacer, it is possible to obtain the desired height inexpensively yet easily. The spacer material may be resin beads, silica beads, glass beads, glass fibers, etc., with glass fibers being most preferred. Usually, the spacer has a thickness of preferably about 1 to 500 $\mu$m, more preferably about 10 to 200 $\mu$m and even more preferably about 10 to 20 $\mu$m, or about 100 to 200 $\mu$m.

The spacer may or may not be used when the recess is provided in the sealing plate. When the spacer is used, its size is preferably within the aforesaid range, and more preferably within the range of 10 to 20 $\mu$m. Usually, the amount of the adhesive agent applied is preferably about 1 to 100 mg/cm$^2$, and more preferably about 1 to 10 mg/cm$^2$ although varying with the size of the spacer used, etc.

Preferably, the spacer is used in combination with a sealing adhesive agent, so that the spacer can concurrently be fixed and sealed. Usually, the spacer is in the form of particles having a uniform particle size, and its shape is not particularly critical to the practice of the invention. In other words, the spacer may be used in various forms with the proviso that it can serve its own function. It is here to be noted that when the spacer also serves as an adhesive agent, the spacer may be provided to the sealing sheet as an integral piece.

For the adhesive agent, it is preferable to use a cation curing epoxy resin of the ultraviolet curing type. Each of the organic layers forming the organic EL structure has a glass transition temperature of usually 140° C. or lower, and especially about 80 to 100° C. For this reason, an ordinary thermosetting type adhesive agent cannot be used with an organic EL device, because its setting temperature is of the order of 140 to 180° C.; the organic EL structure is softened upon the setting of the adhesive agent, resulting in a deterioration in its performance. With an ultraviolet curing type adhesive agent, on the other hand, such a softening problem does not arise. However, a commonly used current ultraviolet curing type adhesive agent is an acrylic adhesive agent which is found to have an adverse influence on structural materials forming the organic EL structure because of the volatilization of the acrylic monomer contained therein during curing. As a consequence, the performance of the organic EL structure suffers deterioration. In the practice of the invention, it is thus preferable to use the aforesaid cation curing type ultraviolet curing epoxy resin adhesive agent which is completely or substantially free of such problems.

Commercially available ultraviolet curing type epoxy resin adhesive agents include a combined ultraviolet and heat curing type epoxy resin adhesive agent. In this case, a radical curing type acrylic resin is often mixed or modified with a heat curing type epoxy resin. In other words, this adhesive agent is not preferable for use with the organic EL device of the invention because the problem incidental to the volatilization of the acrylic monomer in the acrylic resin or the problem in connection with the setting temperature of the thermosetting type epoxy resin remains still unsolved.

By the "cation curing type ultraviolet curing epoxy resin adhesive agent" used herein is intended an adhesive agent of the type which contains as a primary curing agent a Lewis acid-base type curing agent subjected to photo-decomposition upon ultraviolet or other light irradiation to release a Lewis acid catalyst, and in which a main component epoxy resin is polymerized and cured through a cation polymerization type reaction mechanism while a Lewis acid generated by light irradiation acts as a catalyst.

The epoxy resin contained as the main component in the aforesaid adhesive agent, for instance, includes an epoxidized olefin resin, an alicyclic epoxy resin, and a novolak epoxy resin. The aforesaid curing agent, for instance, includes a Lewis acid-base of aromatic diazonium, a Lewis acid-base of diallyliodonium, a Lewis acid-base of triallylsulfonium, and a Lewis acid-base of triallylselenium.

The organic EL device closed up with the adhesive agent is preferably filled therein with an inert gas such as He, $N_2$, and Ar. It is then desired that the inert gas filled in this airtight space contain moisture in an amount of preferably up to 100 ppm, more preferably up to 10 ppm, and even more preferably up to 1 ppm. The lower limit to this moisture content is usually about 0.1 ppm although the invention is not limited thereto.

Preferably but not exclusively, the height of the organic EL structure provided in a film form is in the range of usually 100 to 1,000 nm, and especially 300 to 800 nm. Also, the distance of the surface of the substrate, on which the film form of organic EL structure is provided, to the lower end face of the sealing sheet is preferably up to 200 µm, and especially between about 80 µm and about 150 µm.

The organic EL device of the invention will then be explained with reference to FIGS. 1 to 2.

FIG. 1 is a sectional view of one embodiment of the organic EL device according to the invention. As illustrated, the organic EL device of the invention comprises a substrate 1, an organic EL structure 2 stacked on the substrate 1, a sealing sheet 3 located on the organic EL structure 2 with a predetermined space between them, and a spacer 4 located at a junction 3a of the sealing sheet 3 with the substrate 1 for keeping the sealing sheet 3 at a given distance from the substrate 1. It is here to be noted that the junction 3a is coated or otherwise applied with an adhesive agent (not shown) to fix the sealing sheet 3 to the substrate 1. As illustrated, the sealing sheet 3 has an irregularity or undulation whose size is represented by a, and a distance b from the upper end of the organic EL structure to the junction of the sealing sheet with the substrate is larger than the size a of the irregularity or undulation. Thus, a distance d from the surface of the substrate 1, on which the film form of organic EL structure is provided, to the junction 3a of the sealing sheet 3 is given by a height c of the organic EL structure plus the size a of the irregularity or undulation plus a given space e.

Figure 2:
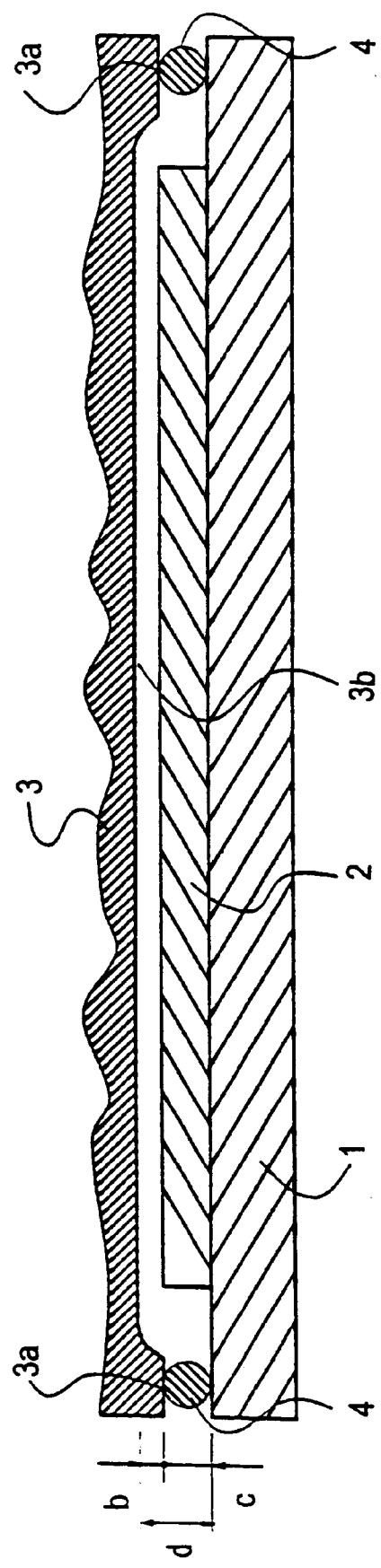
FIG. 2 is a sectional view illustrating another embodiment of the organic EL device according to the invention, wherein a recess is provided in a sealing sheet.
Figure 3:
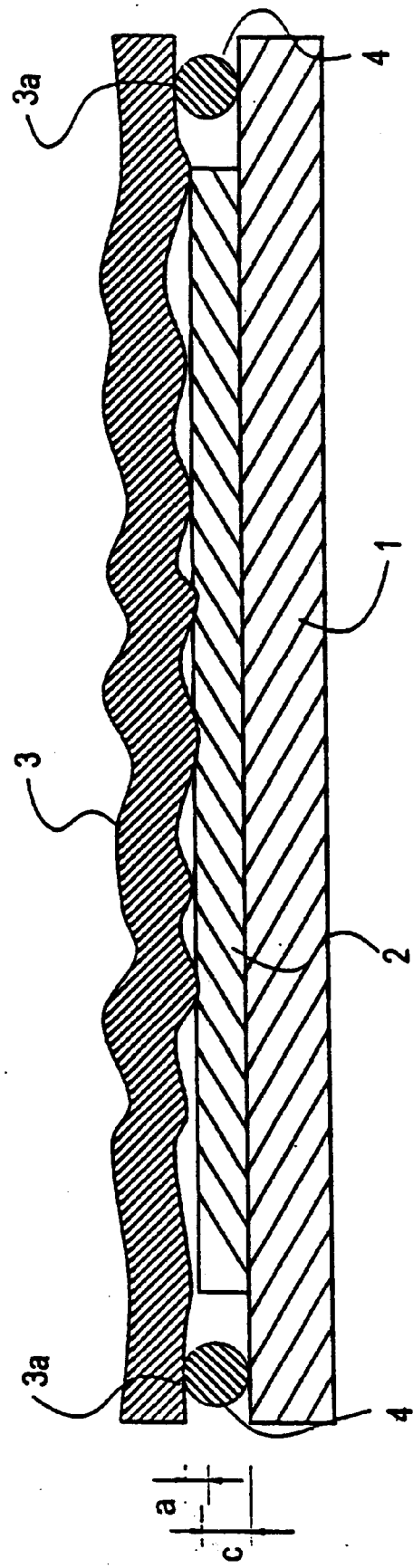
FIG. 3 is a sectional view illustrating one exemplary arrangement of a conventional organic EL device.

FIG. 2 illustrates another embodiment of the organic EL device of the invention, wherein a recess 3b is provided in at least a portion of a sealing sheet 3 that opposes to an organic EL structure 2 for the purpose of preventing the sealing sheet from interfering with the organic EL structure. More illustratively, the recess 3b having a given depth b is formed in a portion of the sealing sheet that opposes to the organic EL structure 2, whereby a given space b can be defined between the upper end of the organic EL structure and the lower end face of the sealing sheet 3 (i.e., the bottom of the recess). In this case, too, it is possible to prevent the sealing sheet 3 from coming into contact with, and interfering with the organic EL structure 2. Here the lower end face of the sealing sheet 3 represents the bottom of the recess, and a height d from the surface of the substrate 1 to the lower end face of the sealing sheet 3 is given by adding the aforesaid space b to the height c of the organic EL structure. In this embodiment, a junction 3a of the sealing sheet 3 is flush with the upper end of the organic EL structure. However, the junction 3a may be located above or below the upper end of the organic EL structure, and may be located at a position lower than that in the aforesaid embodiment. Although depending on the height of the organic EL structure, and the depth of the recess, the junction 3a may be bonded directly to the upper face of the substrate 1 without using a spacer 4.

Next, the organic EL structure forming part of the organic EL device according to the invention is explained. The organic EL structure of the invention comprises on the substrate a hole injecting electrode, an electron injecting electrode, and at least one organic layer interleaved between both the electrodes. Each or the organic layer comprises at least one hole transporting layer and at least one light emitting layer, and is provided thereon with an electron injecting electrode. In addition, a protective electrode may be provided in the form of the uppermost layer. It is to be noted that the hole transporting layer may be dispensed with. The electron injecting electrode in a film form is made up of a metal having a low work function or a compound or alloy thereof by means of evaporation, and sputtering techniques, preferably a sputtering process.

For the hole injecting electrode, it is usually preferable to use a transparent electrode because the organic EL device is designed to take out the emitted light from the substrate side thereof. Such a transparent electrode, for instance, include ITO (tin-doped indium oxide), IZO (zinc-doped indium oxide), ZnO, $SnO_2$, and $In_2O_3$, with ITO (tin-doped indium oxide), and IZO (zinc-doped indium oxide) being preferred. Referring to ITO, it is desired that the mixing ratio of $SnO_2$ with respect to $In_2O_3$ be in the range of 1 to 20 wt %, and especially 5 to 12 wt %. Referring to IZO, it is again desired that the mixing ratio of ZnO with respect to $In_2O_3$ be in the range of 1 to 20 wt %, and especially 5 to 12 wt %. Besides, ITO, and IZO may contain an oxide form of Sn, Ti, Pb, etc. in an amount of up to 1 wt % calculated as oxide.

The hole injecting electrode may be formed as by evaporation, but should preferably be formed by a sputtering technique. When a sputtering process is applied to the formation of an ITO or IZO electrode, it is preferable to use a target comprising $In_2O_3$ doped with $SnO_2$ or ZnO. An ITO transparent electrode, when formed by the sputtering technique, suffers a lesser light emission luminance change with time, as compared with an electrode formed by evaporation. For the sputtering technique, it is preferable to use DC sputtering. Power input is then preferably in the range of 0.1 to 4 $W/cm^2$. Power input for a DC sputtering system in particular is in the range of preferably 0.1 to 10 $W/cm^2$, and more preferably 0.2 to 5 $W/cm^2$. The film forming rate is preferably in the range of 2 to 100 nm/min., and especially 5 to 50 nm/min.

Preferably but no exclusively, an inert gas such as Ar, He, Ne, Kr, and Xe or a mixture of such inert gases is used as the sputtering gas. The sputtering pressure of such gases may usually be of the order of 0.1 to 20 Pa.

The hole injecting electrode may have at least a certain thickness enough for hole injection; that is, it may have a thickness of usually 5 to 500 nm, and especially 10 to 300 nm.

For the material that forms a film form of electron injecting electrode, it is preferable to use a material effective for injection of electrons and having a low work function, e.g., any one of metal elements K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, or compounds such as BaO, BaS, CaO, HfC, LbB$_6$, MgO, MoC, NbC, PbS, SrO, TaC, ThC, ThO$_2$, ThS, TiC, TiN, UC, UN, UO$_2$, W$_2$C, Y$_2$O$_3$, ZrC, ZrN, and ZrO$_2$. To improve the stability of the electrode, it is also preferable to use binary or ternary alloy systems containing metal elements. Preferred alloy systems, for instance, are aluminum alloy systems such as Al.Ca (Ca: 5 to 20 at %), Al.In (In: 1 to 10 at %), Al.Li (0.1 at %≦Li<20 at %), and Al.R where R stands for a rare earth element including Y, and Sc, and In.Mg systems (Mg: 50 to 80 at %). Particular preference is given to pure Al, and aluminum alloy systems such as Al.Li (0.4 at %≦Li<6.5 at % or 6.5 at %≦Li <14 at %), and Al.R (R: 0.1 to 25 at %, and especially 0.5 to 20 at %) because they are unlikely to produce compression stress. Thus, such electron injecting electrode-forming metals or alloys are usually employed as sputtering targets. These metals or alloys have a work function of 4.5 eV or lower. In the practice of the invention, it is particularly preferable to use metals or alloys having a work function of 4.0 eV or lower.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are absorbed, by reverse sputtering to form a clean electrode-organic layer interface or a clean electrode, so that consistent organic EL devices of high quality can be produced. For the target, the alloys having the aforesaid composition range, and pure metals may be used alone or in combination with an additional target comprising a subordinate component or components or with the addition of a subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL devices having an ever longer service life.

Preferably, the sputtering gas pressure during sputtering is in the range of 0. 1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above. Film formation conditions are preferably such that the product of the film-forming gas pressure and the substrate-target distance satisfies 20 to 65 Pa.cm.

For the sputtering gas, use is made of inert gases employed with ordinary sputtering systems. For reactive sputtering, reactive gases such as N$_2$, H$_2$, O$_2$, C$_2$H$_4$, and NH$_3$ may be used in addition to these gases.

In the practice of the invention, it is possible to use an RF sputtering process using an RF power source or the like as the sputtering technique. In view of the ease with which the film forming rate is controlled, and less damage to the organic EL structure, however, it is preferable to use a DC sputtering process. Power for operating a CD sputtering system is in the range of preferably 0.1 to 10 W/cm$^2$, and especially 0.5 to 7 W/cm$^2$. The film forming rate is preferably in the range of 5 to 100 nm/min., and especially 10 to 50 nm/min.

The thin film form of electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereto.

The organic EL device of the invention may preferably have a protective electrode on the electron injecting electrode, i.e., on the side of the electron injecting electrode that faces away from the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may contain at least one of Al; Al and a transition metal except Ti; Ti; and titanium nitride (TiN). When these are used alone, the protective electrode preferably contains Al in an amount of about 90 to 100 at %, Ti in an amount of about 90 to 100 at %, and TiN in an amount of about 90 to 100 mol %. Two or more of Al, Ti and TiN may be used at any desired mixing ratio. For instance, a mixture of Al and Ti preferably contains Ti in an amount of up to 10 at %. Alternatively, it is acceptable to laminate together laminae each containing a single species. In particular, favorable results are obtained when Al or Al plus transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al alloys, and transition metal alloys may contain transition metals, especially Sc, Nb, Zr, Hf, Nd, Ta, Cu, Si, Cr, Mo, Mn, Ni, Pd, Pt and W in the total amount of up to 10 at %, especially up to 5 at %, and more especially up to 2 at %. When the protective electrode functions as the interconnecting material, the thin film resistance becomes lower with a decrease in the content of the transition metal.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode layer to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as SiOx or an organic material such as Teflon, and a chlorine-containing carbon fluoride polymer. The protective film may be either transparent or opaque, and has a thickness of the order of 50 to 1,200 nm. The protective film may be formed either by the aforesaid reactive sputtering process or conventional processes such as general sputtering, evaporation or PECVD.

Next, the organic material layers provided in the organic EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the hole injecting electrode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit to thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in Japanese Patent Application No. 6-110569 and tetraarylethene derivatives disclosed in Japanese Patent Application No. 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato)(m-phenylphenolato)aluminum (III), bis(2-methyl-8-quinolinolato)(p-phenylphenolato)aluminum (III), bis(2-methyl-8-quinolinolato)(2,3-dimethylphenolato) aluminum (III), bis(2-methyl-8-quinolinolato)(2,6-dimethylphenolato)aluminum (III), bis(2-methyl-8-quinolinolato)(3,4-dimethylphenolato)aluminum (III), bis(2-methyl-8-quinolinolato)(3,5-dimethyl-phenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethyl-phenolato)aluminum (III), bis(2-methyl-8-quinolinolato)(2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato)(m- phenylphenolato) aluminum (III), bis(2,4-dimethyl-8-quinolinolato)(3,5-dimethylphenolato)aluminum (III), bis(2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-μ-oxo-bis(2-methyl-8-quinolinolato)aluminum (III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum (III)-μ-oxo-bis(4-ethyl-2-methyl-8-quinolinolato)aluminum (III), bis(2-methyl-4-methoxyquinolinolato)aluminum (III)-μ-oxo-bis(2-methyl-4-methoxyquinolinolato)aluminum (III), bis(5-cyano-2-methyl-8-quinolinolato)aluminum (III)-μ-oxo-bis(5-cyano-2-methyl-8-quinolinolato)aluminum (III), bis(2-methyl-5-trifluoromethyl-8-quinolinolato)aluminum (III)-μ-oxo-bis(2-methyl-5-trifluoromethyl-8-quinolinolato)aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

In the practice of the invention, the light emitting layer may also serve as an electron injecting and transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato)aluminum (Alq$^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed nearest to the hole injecting electrode (ITO, etc.). It is also preferred to use a compound having good thin film forming ability at the surface of the anode. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. As is the case with the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferable combination from the compounds commonly used for electron injecting and transporting layers. In this regard, it is preferred to laminate layers in such an order that a compound layer having a greater electron affinity is disposed nearest to the electron injecting electrode. This order of lamination also applies where a plurality of electron injecting and transporting layers are provided.

The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of $10^{-4}$ Pa or lower. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some examples.

Example 1

A glass substrate was provided thereon with an 85 nm-thick ITO transparent electrode (hole injecting electrode) in such a way that pixels (280×280 $\mu$m per pixel) were patterned on the ITO transparent electrode according to an array of 64 dots×7 lines. Then, the substrate with the patterned hole injecting electrode formed on it was ultrasonically washed with neutral detergent, acetone, and ethanol, and then pulled up from boiling ethanol, followed by drying. The substrate was subsequently cleaned on its surface with UV/$O_3$. Then, the substrate was fixed to a substrate holder in a vacuum evaporation system, which was evacuated to a vacuum of $1\times10^{-4}$ Pa or lower. 4,4',4"-tris(-N-(3-methylphenyl)-N-phenylamino)triphenylamine (m-MTDATA) was deposited by evaporation at a deposition rate of 0.2 nm/sec. to a thickness of 40 nm, thereby forming a hole injecting layer. With the vacuum still maintained, N,N'-diphenyl-N,N'-m-tolyl-4,4'-diamino-1,1'-biphenyl (TPD) was then deposited by evaporation at a deposition rate of 0.2 nm/sec. to a thickness of 35 nm, thereby forming a hole transporting layer. With the vacuum still kept, tris(8-quinolinolato)aluminum ($Alq^3$) was deposited by evaporation at a deposition rate of 0.2 nm/sec. to a thickness of 50 nm, thereby forming a combined electron injecting/transporting and light emitting layer. With the vacuum still kept, MgAg was deposited by co-evaporation at an evaporation rate ratio of Mg:Ag=1:10 to a thickness of 200 nm, thereby forming an electron injecting layer. With the vacuum still maintained, this EL device substrate was transferred to a sputtering system where an Al protective film of 200 nm in thickness was formed at a sputtering pressure of 0.3 Pa by means of a DC sputtering process using an Al target. Ar was used for the sputtering gas, with a power input of 500 W, a target diameter of 4 inches, and a substrate-target distance of 90 mm. The thus obtained film form of organic EL structure had a total thickness of 610 nm. Finally, an adhesive agent and spacers shown in Table 1 were used to bond a glass material sealing sheet shown in Table 1 to the substrate and thereby close up an organic EL structure. The glass material used was soda lime glass of 1.1 mm and 0.7 mm in thickness. Some sheet glasses were ground (with 20 $\mu$m undulations of the 1.1 mm thick glass, and 15 to 20 $\mu$m undulations of the 0.7 mm thick glass), and some glasses were not ground (with 30 to 40 $\mu$m thick undulations of the 1.1 mm thick glass).

In the air atmosphere, a DC voltage was applied on the thus obtained organic EL device to drive it continuously for 100 hours at a constant current density of 10 mA/cm$^2$ under acceleration conditions of 60° C. temperature and 95% humidity to make estimation of the occurrence of dark spots. The results are shown in Table 1.

TABLE 1

| Sample No. | Thickness of sealing sheet | Undulations ($\mu$m) | Spacer ($\mu$m) | Dark Spots |
| --- | --- | --- | --- | --- |
| 1 | 1.1 mm | 20 | 100 | <10 $\mu$m, undetected |
| 2* | 1.1 mm | 20 | 20 | 20–50 $\mu$m |
| 3* | 1.1 mm | 20 | 7 | 50–100 $\mu$m |
| 4 | 1.1 mm | 30–40 | 100 | <10 $\mu$m, undetected |
| 5* | 1.1 mm | 30–40 | 20 | 50–100 $\mu$m |
| 6* | 1.1 mm | 30–40 | 7 | 50–200 $\mu$m |
| 7 | 0.7 mm | 20 | 100 | <10 $\mu$m, undetected |
| 8* | 0.7 mm | 20 | 20 | 25–100 $\mu$m |
| 9* | 0.7 mm | 20 | 7 | 50–200 $\mu$m |

*Comparison

As can be seen from Table 1, dark spots are little found in the inventive samples. Thus, the inventive samples show good performance.

Example 2

Organic EL devices were prepared following Example 1 with the exception that recesses were provided in the unground glass sealing sheets of 1.1 mm in thickness, used in Example 1, by processing means shown in Table 2, and these recesses were bonded to the substrates with no use of any spacer while they were in opposition to the organic EL structures.

As in Example 1, the obtained organic EL devices were estimated. The results are shown in Table 2.

TABLE 2

| Sample No. | Thickness of sealing sheet | Processing of sealing sheet | Depth of recess ($\mu$m) | Dark Spots |
| --- | --- | --- | --- | --- |
| 11 | 1.1 mm | Sandblasting | 100 | <10 $\mu$m, undetected |
| 12* | 1.1 mm | Sandblasting | 20 | 50–100 $\mu$m |
| 13 | 1.1 mm | Etching | 100 | <10 $\mu$m, undetected |
| 14 | 1.1 mm | Etching | 20 | 10–25 $\mu$m |
| 15 | 1.1 mm | Grinding | 100 | <10 $\mu$m, undetected |
| 16* | 1.1 mm | Grinding | 20 | 10–50 $\mu$m |

*Comparison

As can be seen from Table 1, dark spots are little found in the inventive samples. Thus, the inventive samples show good performance.

According to the present invention, it is thus possible to provide an organic EL device comprising a sealing sheet that can be produced at low costs yet with high productivity, and can have no interference with an organic EL structure while there is a proper clearance between them.

Japanese Patent Application No. 299524/1987 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What we claim is:

1. An organic electroluminescent device comprising:

a substrate;

an organic electroluminescent structure provided on a surface of the substrate; and a sealing sheet located at a position above said substrate, wherein said sealing sheet is mechanically isolated from said organic electroluminescent structure, and a height from said surface of said substrate to a bottom surface of said sealing sheet is larger than a sum of an irregularity or undulation height of said sealing sheet and an organic electroluminescent structure height.

2. The organic electroluminescent device according to claim 1, wherein said sealing sheet comprises an unground flat sheet.

3. The organic electroluminescent device according to claim 1, wherein the irregularity or undulation height of said sealing sheet is less than 60 $\mu$m.

4. The organic electroluminescent device according to claim 1, wherein the height is less than or equal to 120 $\mu$m.

5. The organic electroluminescent device according to claim 1, further comprising a spacer interleaved between the surface of said substrate and the bottom surface of said sealing sheet.

6. The organic electroluminescent device according to claim 1, wherein said sealing sheet further comprises a recess provided in a bottom side of said sealing sheet over at least an area of said sealing sheet that opposes said organic electroluminescent structure, the height from the surface of said substrate to the bottom surface of said sealing sheet being adjusted by a depth of said recess.

7. The organic electroluminescent device according to claim 6, wherein the recess in said sealing sheet is formed by sandblasting or cutting.

8. The organic electroluminescent device according to claim 6, further comprising:

an adhesive agent bonding said sealing sheet to said substrate; and a spacer having a spacer height between 3 and 10 $\mu$m.

* * * * *